(12) United States Patent
Amborg et al.

(10) Patent No.: US 6,551,912 B2
(45) Date of Patent: Apr. 22, 2003

(54) METHOD OF FORMING A CONDUCTIVE COATING ON A SEMICONDUCTOR DEVICE

(75) Inventors: Torkel Amborg, Stockholm (SE); Ulf Smith, Huddinge (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/842,209

(22) Filed: Apr. 26, 2001

(65) Prior Publication Data

US 2002/0016052 A1 Feb. 7, 2002

(30) Foreign Application Priority Data

Apr. 26, 2000 (SE) ................................................ 1510-7

(51) Int. Cl.$^7$ ............................................. H01L 21/20
(52) U.S. Cl. ....................... 438/584; 438/125; 438/613; 438/614
(58) Field of Search ................................ 257/358, 777, 257/778, 787; 438/125, 584, 613, 614

(56) References Cited

U.S. PATENT DOCUMENTS

| 4,734,749 | A | | 3/1988 | Levi | |
|---|---|---|---|---|---|
| 5,166,097 | A | * | 11/1992 | Tanielian | 437/203 |
| 5,633,047 | A | * | 5/1997 | Brady et al. | 427/437 |
| 5,877,037 | A | | 3/1999 | O'Keefe et al. | |
| 5,956,605 | A | * | 9/1999 | Akram et al. | 438/613 |
| 6,331,735 | B1 | * | 12/2001 | Blish, II et al. | 257/777 |
| 6,376,769 | B1 | * | 4/2002 | Chung | 174/52.2 |

OTHER PUBLICATIONS

JP 5160257 Abstract (Fujitsu Ltd), Jun. 25, 1993, World Patents Index (online), London, UK, Derwent Publications, Ltd. (retrieved on Oct. 19, 2000); Retrieved from EPO WPI Database.DW 199330, Access No. 1993–238189 & JP 5160257 A Oct. 6, 1993 (abstract) (online) (retrieved on Oct. 19, 2000) retrieved from EPO PAJ Database.

JP 10256491 Abstract (NEC Corp et al), Nov. 25, 1998, World Patents Index (online), London, UK, Derwent Publications, Ltd. (retrieved on Oct. 19, 2000); Retrieved from EPO WPI Database.DW 200004, Access No. 1998–574682 & JP 10256491 A Dec. 31, 1998 (abstract) (online) (retrieved on Oct. 19, 2000) retrieved from EPO PAJ Database.

JP 7029857 Abstract (NEC Yamaguchi Ltd), Jan. 31, 1995, World Patents Index (online), London, UK, Derwent Publications, Ltd. (retrieved on Oct. 19, 2000); Retrieved from EPO WPI Database.DW 199514, Access No. 1995–103271 & JP 7029857 A May 31, 1995 (abstract) (online) (retrieved on Oct. 19, 2000) retrieved from EPO PAJ Database.

JP 8037167 Abstract (Hitachi Ltd), Feb. 6, 1996, World Patents Index (online), London, UK, Derwent Publications, Ltd. (retrieved on Oct. 19, 2000); Retrieved from EPO WPI Database.DW 199625, Access No. 1996–148705 & JP 8037167 A Jun. 28, 1996 (abstract) (online) (retrieved on Oct. 19, 2000) retrieved from EPO PAJ Database.

* cited by examiner

Primary Examiner—David Nelms
Assistant Examiner—Dao H. Nguyen
(74) Attorney, Agent, or Firm—Nixon & Vanderhye P.C.

(57) ABSTRACT

On a semiconductor die, a conductive layer is formed by first attaching a semiconductor wafer to a support wafer, then cutting the semiconductor wafer into dies, and finally depositing a conductive layer on the sides of the dies. The conductive layer is preferably a metal layer, which extends into the support wafer, which ensures that, when the support wafer is removed, the conductive layer extends all the way over the sidewall of the semiconductor die. The method allows the simultaneous application of the conductive layer to many dies. The conductive layer reduces the resistance for currents in the radio frequency range flowing close to the edges of the die due to the skin effect.

12 Claims, 1 Drawing Sheet

METHOD OF FORMING A CONDUCTIVE COATING ON A SEMICONDUCTOR DEVICE

The present invention relates to a method of forming a conductive coating on a semiconductor device, and in particular of forming a conductive coating on a semiconductor device for reducing the skin effect in such a semiconductor component.

BACKGROUND

In radio applications, in particular applications comprising power amplifiers, many transistors have large active silicon areas. Furthermore, the transistors, which can be discrete or integrated, handle high currents at high frequencies, typically in the GHz range.

Usually one contact terminal of such transistors is connected to the package of the semiconductor device, that holds the respective transistor chip, via the semiconductor substrate and in particular to a metal part of the package, usually called a leadframe.

The terminal connected to the package can vary between different applications. However, usually it is the emitter terminal in bipolar technology and the source terminal in MOS technology. At low frequencies, including DC, the current will flow homogeneously through the semiconductor and the resistance will be low.

However, due to the skin effect it is known that currents in the radio frequency range will flow close to the edges of the die as shown in FIG. 1. In such a case the skin effect will cause the resistance to be several orders of magnitude higher than the resistance at lower frequencies.

Furthermore, the transistor is often connected to a circuit in which the impedance in series with the terminal is critical in order to obtain high performance in terms of power gain, linearity efficiency, thermal behaviour, etc. This impedance will affect the performance negatively and in particular if the resistive part of the impedance becomes large. Thus, there is a problem in some applications when the impedance is high due to the skin effect.

In order to solve this problem it is possible to attach bond wires to the transistor. However, a bond wire solution is not feasible in some applications because the maximum number of bond wires is limited. Also, the use of bond wires is expensive because they have to be attached to each separate die during assembly as opposed to interconnections on wafers, which are attached on all dies simultaneously. Another disadvantage using bond wires is added parasitic inductance.

Furthermore, in U.S. Pat. No. 5,877,037 a process for reducing bond resistance in semiconductor devices and semiconductor circuits is disclosed. According to the process a coating, preferably a metal coating, is deposited on the sidewalls of a semiconductor component in order to reduce the skin effect sheet resistance of the semiconductor component.

However, the method of depositing the metal coating as described in this patent is both time consuming and also does not result in a metal layer adequate for many applications. Moreover, the metal layer has to be applied individually for each component or device.

SUMMARY

It is an object of the present invention to overcome the problems as outlined above and to provide a method, which provides an improved conductive layer on the side walls of the semiconductor devices/components and which is more cost efficient in terms of processing costs and processing time.

This object and others are obtained by a method wherein a conductive layer, in particular a metal layer, in one single process step is applied on the side walls before a wafer being processed is partitioned into separate dies.

Thus, a conductive layer is formed on a semiconductor die by first attaching a semiconductor wafer to a support wafer using for example a wax or an adhesive, then cutting the semiconductor wafer into dies, and finally depositing a conductive layer on the sides of the dies.

The conductive layer is preferably a metal layer extending into the support layer, which ensures that, when the support wafer is removed, the conductive layer extends all the way over the sidewall of the semiconductor die.

Additional objects and advantages of the invention will be set forth in the description which follows, and in part will be obvious from the description, or may be learned by practice of the invention. The objects and advantages of the invention may be realized and obtained by means of the methods, processes, instrumentalities and combinations particularly pointed out in the appended claims.

BRIEF DESCRIPTION OF THE DRAWINGS

While the novel features of the invention are set forth with particularly in the appended claims, a complete understanding of the invention, both as to organization and content, and of the above and other features thereof may be gained from and the invention will be better appreciated from a consideration of the following detailed description of non-limiting embodiments presented hereinbelow with reference to the accompanying drawings, in which:

DETAILED DESCRIPTION

Figure 1:
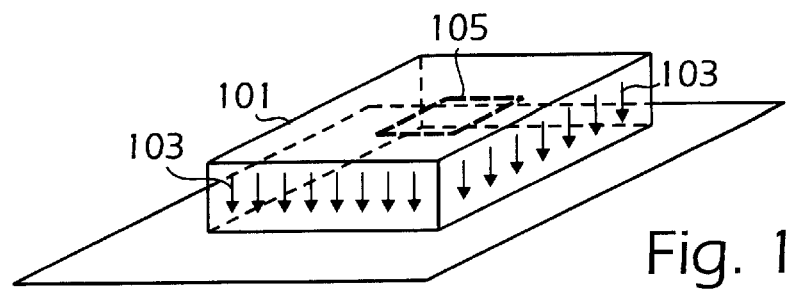
FIG. 1 is a general view of a semiconductor die illustrating the edge currents due to the skin effect in such a semiconductor die.

In FIG. 1 the main paths of currents flowing in a semiconductor die 101 are shown by the arrows 103. Thus, due to the skin effect currents having frequencies within the radio frequency range and resulting from transistors 105 formed in the semiconductor die will flow close to the edges of the die as illustrated in FIG. 1. In such a case the skin effect will cause the resistance to be several orders of magnitudes higher than in a corresponding device operated at lower frequencies.

In order to solve the problem of an increased resistance in the rf-case, an electrically conductive coating is formed on the sidewalls of the semiconductor die, which reduces the negative effects introduced by the skin effect.

Figure 2:
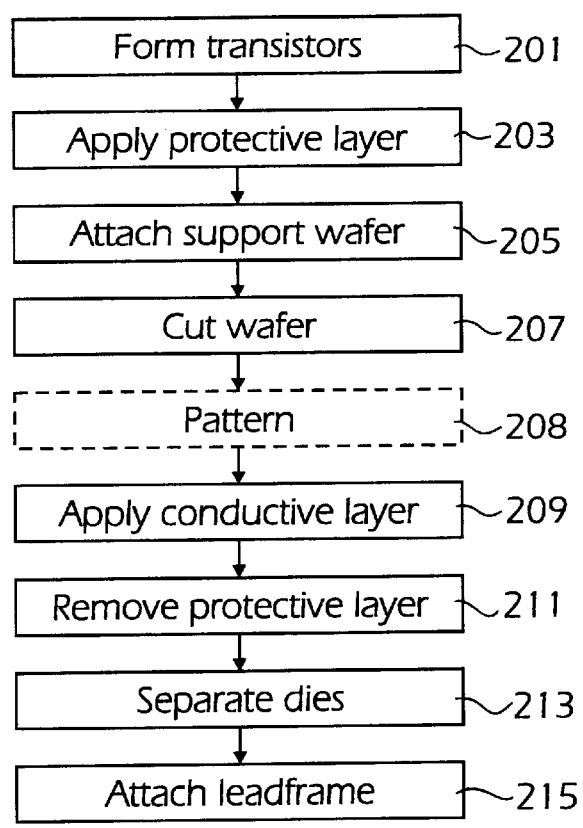
FIG. 2 is a flow chart of different processing steps performed when applying a conductive coating on a semiconductor die.

In FIG. 2, a flow chart of different processing steps performed when applying a conductive coating on a semiconductor die is shown.

First, in a step 201 conventional processing of a semiconductor wafer is performed, such as the processing steps required for manufacturing transistor circuits on the wafer. Next, in a step 203, the wafer is coated with a protective layer, in particular a layer of a photo-resist. The circuit wafer is then mounted on a supporting wafer in a suitable manner, such as by an electrically conductive or non-conductive wax, in a step 205.

Next, in a step 207, the assembly formed by the circuit wafer and the support wafer is cut along suitable lines whereby the individual dies on the circuit wafer are separated from each other. The cutting in the step 207 can be performed using equipment conventionally used for dicing wafers and is preferably performed along straight lines. The depth of the kerfs made in the cutting operation is preferably adjusted so that the kerfs made penetrate all the way through the circuit wafer and slightly into the support wafer. The width of the kerfs is preferably chosen so that requirements for a subsequent metallization process to be described are met Thus, the aspect ratio, i.e. the ratio of the depth to the width, of the kerfs has to be optimized.

Thereupon, in a step 209, an electrically conductive layer, in particular a metal layer, is deposited on the side walls of, preferably, all dies formed by the cutting process in the previous step 207. Examples of suitable processes for depositing the conductive layer on the sidewalls include sputtering, evaporation and electrolytic or electroless deposition. The material deposited to form the conductive layer is deposited on the circuit wafer in a suitable amount in order to form a layer having a desired thickness.

After deposition of the conductive layer, the protective layer is removed in a step 211. Next, in a step 213 the individual dies are separated from the support wafer, for example by heating the assembly formed by the circuit wafer and the support wafer so that, in the case where the material holding the two wafers together is a wax, the wax melts. Finally, the individual dies are attached to lead frames using a conventional method, such as soldering or gluing in a step 215.

In one embodiment of the method described in conjunction with FIG. 2, the conductive layer formed on the side walls does not make a direct contact with the metal being a part of the circuitry on the die, nor with the leadframe thereof. Such a direct contact may not be necessary in some high frequency applications in which capacitive coupling can provide the remaining electrical path.

In some applications a better electrical contact may be required. In such a case the protective layer can be patterned in an additional step 208, before the conductive layer is deposited in the step 209, the patterning opening areas along the edges of the dies. The areas defined by the patterning process can be made to run along a part of or along the whole periphery of an individual die.

When such a patterning has been performed before the conductive layer is deposited the conductive coating will not only cover the sidewalls of the dies, but also other areas as defined by the patterning process. Components formed on top of the semiconductor dies can then be made to contact the electrically conductive layer on the sidewalls by extending the circuit metallization all the way to the areas defined by the patterning process.

In some applications it can also be necessary to improve the contact between the electrically conductive layer on the sidewalls of the dies and the lead frames. Such an improved contact can, for example, be obtained by applying an electrically conductive epoxy polymer used for attaching the die in such an amount that it does not only coat the interface between the dies and the lead frames, but also flows beneath the die and some distance up on the conductive coating on the side walls.

Figure 3:
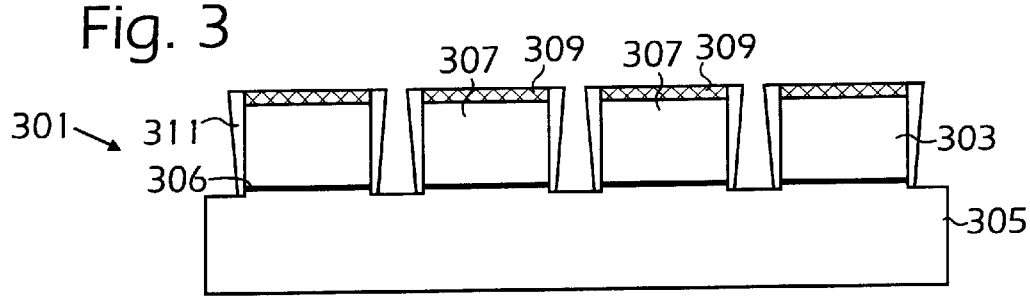
FIG. 3 is a view of a semiconductor wafer processed according to the method, the steps of which are illustrated in FIG. 2.

In FIG. 3 an assembly 301 processed in accordance with the method described in conjunction with FIG. 2 after depositing the conductive layer in the step 209 is shown. The assembly 301 comprises a circuit wafer 303 and a support wafer 305 attached to each other by a wax 306. The circuit wafer 303 comprises a multitude of individual dies 307 having protective coatings 309, which in some applications may be patterned as described above in conjunction with the step 208.

The individual dies 307 also have side walls coated with the electrically conductive layers, in this case metal layers 311, which preferably extend down into the support wafer 305. By letting the layers 311 extend down into the support wafer it is ensured that the thickness of the conductive layers 311 is sufficiently thick all over the surfaces of the sidewalls.

The formation of a conductive coating can be particularly useful when the substrate has a high resistivity, which can be the case where inductive components, such as coils, are formed in the semiconductor dies.

By using the method as described herein a cost efficient way of forming a conductive coating on semiconductor dies is obtained. The method makes it possible to apply the conductive layer for many dies simultaneously and in a manner, which ensures that the layer has a desired thickness all over the surface covered by the conductive layer.

The method as described herein is applicable to all semiconductor materials including silicon, GaAs, InP, SiC and GaN. The conductive layer can be formed by any suitable metal, or a silicide, or any other suitable conductive material.

While specific embodiments of the invention have been illustrated and described herein, it is realized that numerous additional advantages, modifications and changes will readily occur to those skilled in the art. Therefore, the invention in its broader aspects is not limited to the specific details, representative devices and illustrated examples shown and described herein. Accordingly, various modifications may be made without departing from the spirit or scope of the general inventive concept as defined by the appended claims and their equivalents. It is therefore to be understood that the appended claims are intended to cover all such modifications and changes as fall within a true spirit and scope of the invention.

What is claimed is:

1. A method of forming a conductive layer on semiconductor dies, the method comprising the sequential steps of:

providing a semiconductor wafer having first and second surfaces, the second surface being opposite the first surface, attaching the semiconductor wafer at the first surface thereof to a support wafer, cutting the semiconductor wafer into dies forming lateral surfaces on the dies and first and second surfaces of the dies, the first surfaces of the dies being portions of the first surface of the semiconductor wafer and the second surfaces of the dies being portions of the second surface of the semiconductor wafer, and depositing, when the dies are still attached to the support wafer, an electrically conductive layer over the second surface of the semiconductor wafer and thereby over the second surfaces of the dies to cover at least the lateral surfaces of the dies.

2. The method of claim 1, further comprising the step of applying a protective coating on the semiconductor wafer before the step of cutting the semiconductor wafer.

3. The method of claim 2, wherein, in the step of applying the protective coating, the protective coating is applied to include a layer of a photo resist.

4. The method of claim 2, further comprising the step of patterning the protective coating before the step of depositing the electrically conductive layer 5. The method of claim 1, wherein, in the step of depositing the electrically conducive layer, the electrically conductive layer is deposited to include a metal.

6. The method of claim 1, wherein, in the step of attaching the semiconductor wafer to the support wafer, the support wafer is attached to the semiconductor wafer by an electrically conducting or non-conducting wax.

7. The method of claim 1, wherein, in the step of attaching the semiconductor wafer to the support wafer, the support wafer is attached to the semiconductor wafer by an adhesive.

8. The method of claim 1, wherein, in the step of cutting, the semiconductor wafer is cut so that the kerfs produced extend down into the support wafer.

9. The method of claim 1, further comprising the step of removing the support wafer from the semiconductor wafer to thereby form individual semiconductor dies.

10. The method of claim 9, wherein, in the step of attaching the semiconductor wafer to the support wafer, the support wafer is attached to the semiconductor wafer by an electrically conducting or non-conducting wax and in the step of removing, the support wafer is removed by heating theelectrically conducting or non-conducting wax.

11. A method of forming a conductive layer on semiconductor dies, the method comprising:

providing a semiconductor wafer, attaching the semiconductor wafer to a support wafer, cutting the semiconductor wafer into a plurality of dies, each of the dies including at least one lateral surface which extends substantially vertically relative to the support wafer, and depositing, when the dies are still attached to the support wafer, an electrically conductive layer over at least part of the semiconductor wafer and thus the dies so as to cover at least the lateral surfaces of the dies.

12. The method of claim 11, wherein the electrically conductive layer extends beyond a bottom edge of at least one of the dies so as to reach or contact the support wafer.

* * * * *